United States Patent
Tsuji et al.

(10) Patent No.: US 6,408,728 B1
(45) Date of Patent: Jun. 25, 2002

(54) PUNCHING APPARATUS FOR STAMPING AND METHOD FOR PRODUCING THE SAME

(75) Inventors: Hiroyuki Tsuji, Nagoya; Kazumasa Kitamura; Motoo Noritake, both of Ichinomiya; Satoshi Matsubayashi; Shusaku Kabe, both of Kitakyusyu, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/401,227

(22) Filed: Sep. 22, 1999

(30) Foreign Application Priority Data

Sep. 25, 1998 (JP) ............................. 10-271329

(51) Int. Cl.⁷ .................................................. B26F 1/14
(52) U.S. Cl. ...................................... 83/687; 83/698.91
(58) Field of Search .......................... 83/619, 684, 685, 83/687, 691, 695, 698.91

(56) References Cited

U.S. PATENT DOCUMENTS

| 713,526 | A | * | 11/1902 | Stimpson |
| 833,265 | A | * | 10/1906 | Van emon |
| 1,383,673 | A | * | 7/1921 | Thomas |
| 1,897,437 | A | * | 2/1933 | Munro |
| 3,077,135 | A |   | 2/1963 | Henn |
| 3,083,604 | A | * | 4/1963 | Ferren .......................... 83/687 |
| 3,100,411 | A |   | 8/1963 | Airlie |
| 3,103,845 | A |   | 9/1963 | Porter et al. |
| 3,392,617 | A | * | 7/1968 | Henn ........................... 83/687 |
| 3,727,506 | A | * | 4/1973 | Taylor et al. |
| 3,750,502 | A | * | 8/1973 | Ball |
| 3,797,352 | A |   | 3/1974 | Smith |
| 4,742,746 | A | * | 5/1988 | Olsson ......................... 83/691 |
| 4,898,056 | A | * | 2/1990 | Grobb et al. .................. 83/691 |
| 4,976,180 | A | * | 12/1990 | Otto |
| 5,178,050 | A | * | 1/1993 | Kazuhiko ..................... 83/687 |
| 5,452,635 | A |   | 9/1995 | Ong |
| 5,740,712 | A | * | 4/1998 | Watkins et al. ................ 83/687 |
| 6,047,623 | A | * | 4/2000 | Whiteman et al. ............. 83/687 |

\* cited by examiner

Primary Examiner—Kenneth E. Peterson
(74) Attorney, Agent, or Firm—Burr & Brown

(57) ABSTRACT

A stamping punch of a punching apparatus for stamping comprises a grip member which is provided with crosspieces formed between long grooves on side walls of a rectangular parallelepiped, and a plurality of punch members which are formed integrally with the grip member. The respective punch members are arranged in parallel to one another. A plurality of long holes are defined on a punch holder. A large amount of adhesive is contained in the gap between joining surfaces when the grip members of the stamping punches are inserted and secured into the respective long holes. Accordingly, the positional accuracy of the punch member is improved, the accuracy of the hole defined through a workpiece is improved, and it is possible to eliminate any fear of occurrence of defect in shape. Further, the rigidity of the punch member can be improved, the stripper is prevented from application of unbalanced load, and the punch is easily exchangeable.

4 Claims, 15 Drawing Sheets

FIG. 12
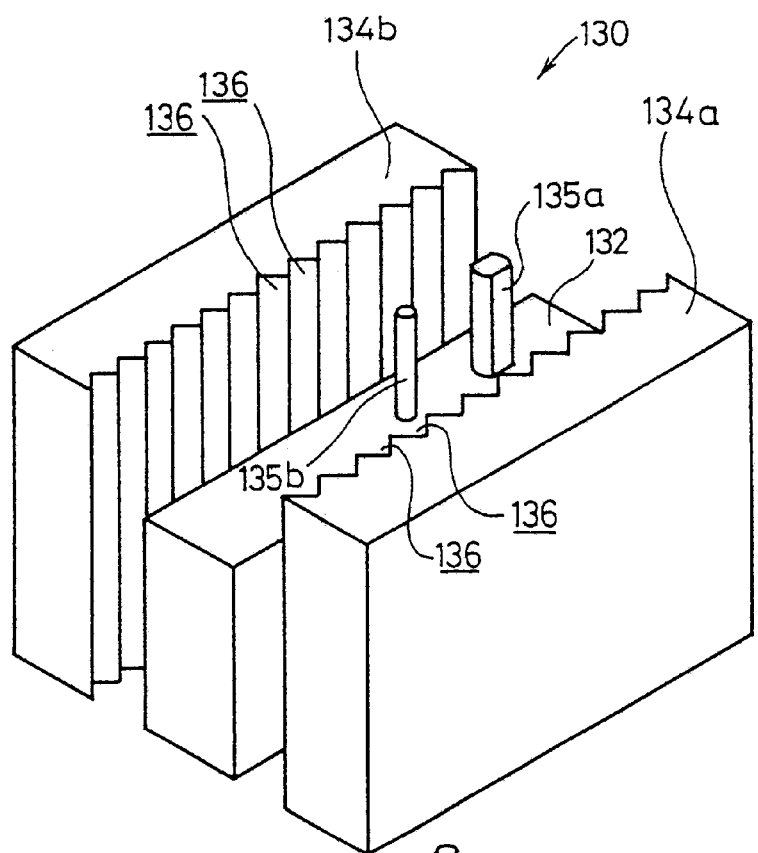
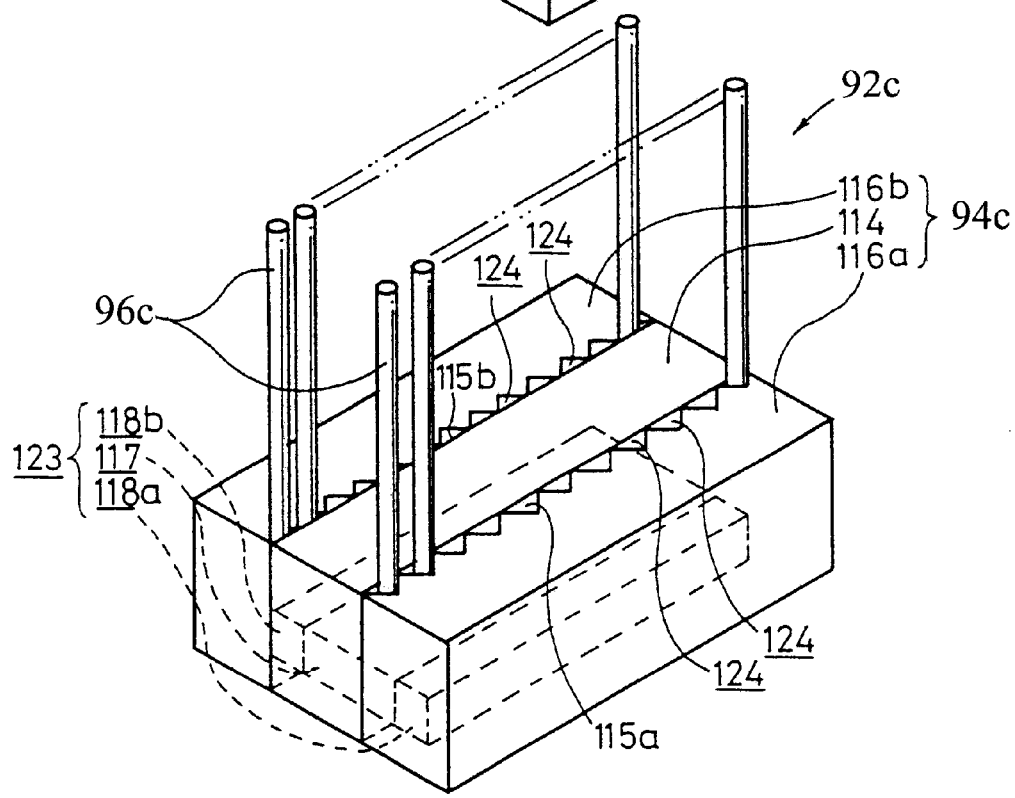

FIG. 14A - Prior Art
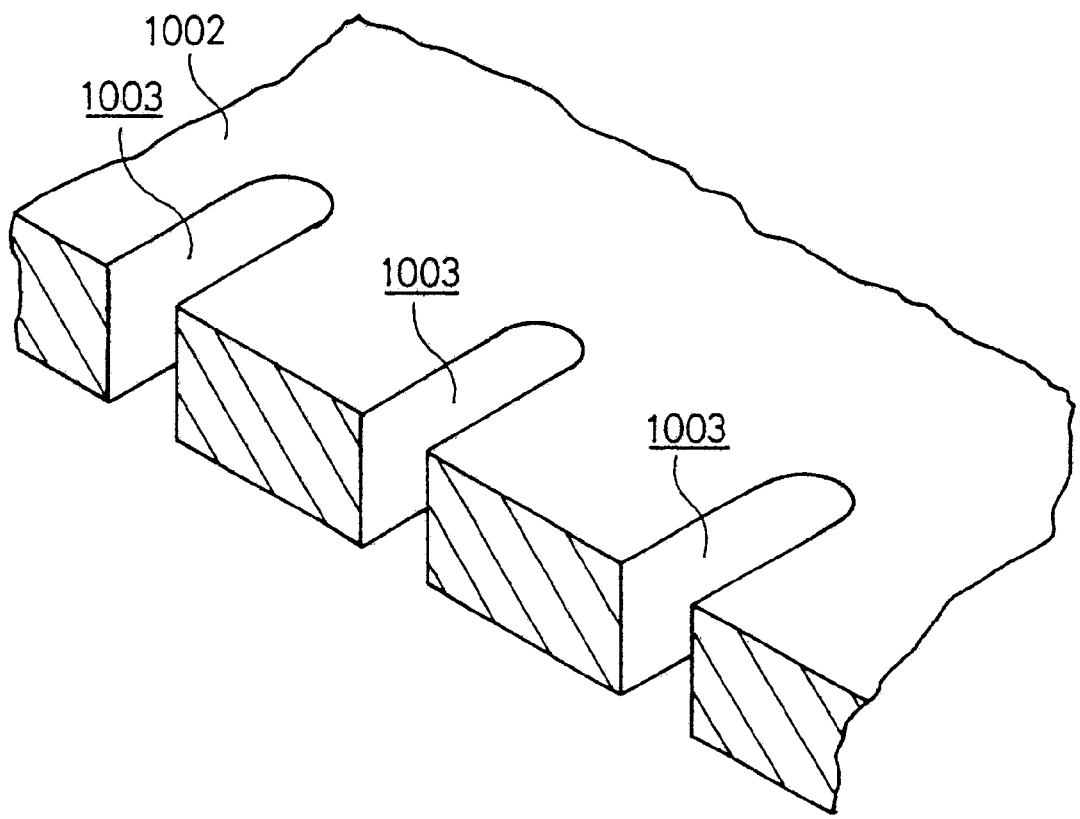
FIG. 14B - Prior Art
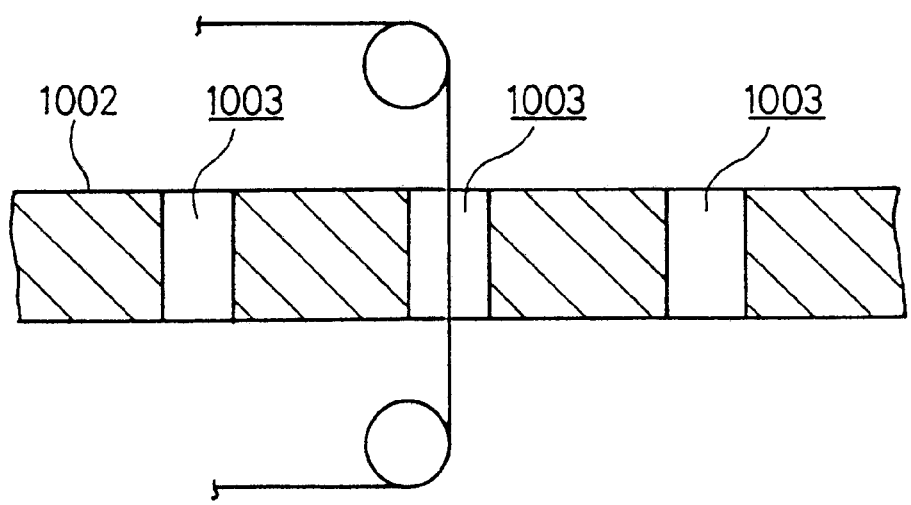

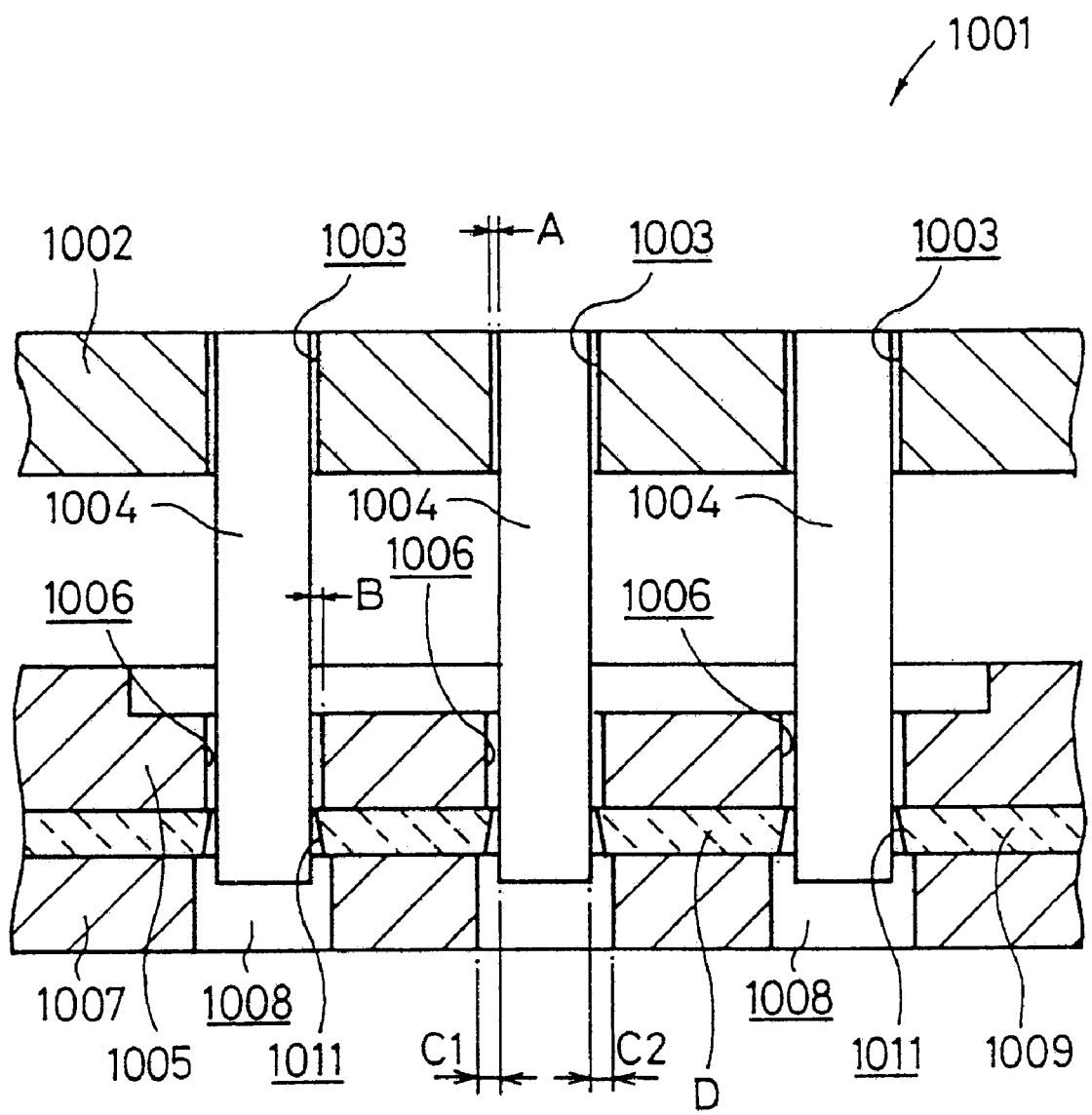
FIG. 15 - Prior Art

PUNCHING APPARATUS FOR STAMPING AND METHOD FOR PRODUCING THE SAME

BACKGROUND OF THE INVENTION

1. Field of the Invention

The present invention relates to a punching apparatus for stamping and a method for producing the same for applying perforating machining to a sheet-shaped workpiece.

2. Description of the Related Art

The punching apparatus for stamping has been hitherto used for defining a plurality of holes through a sheet-shaped workpiece by means of stamping machining. Such a punching apparatus for stamping is constructed as follows. That is, a plurality of lengthy holes 1003 are defined through a metal plate or the like by means of electric discharge machining (see FIG. 14A). The holes are precisely finished by means of wire electric discharge machining to produce a punch holder 1002 (see FIG. 14B).

As shown in FIG. 15, lengthy punch members 1004 having a substantially rectangular cross section are inserted into the holes 1003 which are defined through the punch holder 1002 as described above. Roots of the punch members 1004 are secured to the punch holder 1002 by using, for example, an adhesive.

The punch members 1004 are slidably inserted into lengthy holes 1006 of a stripper 1005 which is provided for the punching apparatus for stamping. Further, the punch members 1004 are inserted into lengthy holes 1008 which are defined through a die 1007.

When a plurality of lengthy holes 1011 are bored through a workpiece 1009 such as a green sheet by using the stamping punching apparatus 1001 constructed as described above, the workpiece 1009 is placed on the die 1007. When the punch members 1004 and the stripper 1005 are moved downwardly, the lower surface of the stripper 1005 firstly abuts against the upper surface of the workpiece 1009. Subsequently, the punch members 1004 are moved downwardly to apply the perforating machining to the workpiece 1009.

However, in the case of the conventional stamping punching apparatus 1001 as described above, it is necessary that the hole 1003 is formed to be slightly larger than the dimension of the punch member 1004 in order to insert the punch member 1004 into the hole 1003. For this reason, a slight gap A is generated between the punch member 1004 and the wall for forming the hole 1003 of the punch holder 1002. Therefore, it is difficult to improve the positional accuracy of the respective punch members 1004.

On the other hand, the holes 1006 defined through the stripper 1005 are also formed to be slightly larger than the rectangular dimension of the punch member 1004. For this reason, a gap B exists between the punch member 1004 and the wall of the hole 1006. As a result, the error in positional accuracy of the punch member 1004 is allowable within a range of the gap B. Therefore, a problem arises in that the positional accuracy and the shape accuracy are lowered for the hole 1011 of the workpiece 1009 subjected to the perforating machining performed by the stamping punching apparatus 1001. Further, any unbalanced load is exerted on the stripper 1005 through which the punch member 1004 is inserted. It is feared that the punch member 1004 and the stripper 1005 may be broken.

The hole 1008 of the die 1007 is formed to be larger than the rectangular dimension of the punch member 1004 so that the punch member 1004 is reliably inserted therethrough even when any error exists in the rectangular dimension of the punch member 1004 or in the position of the punch member 1004 with respect to the punch holder 1002. When the pitch between the punch members 1004 is small, the gap between the hole 1008 and the adjoining hole 1008 is narrow. Therefore, the following problem arises. That is, if there is any difference in size between the gaps C1 and C2 generated between the punch member 1004 and the walls for forming the hole 1008 of the die 1007, any inclination (deformation in the right or left direction in FIG. 15) is caused by the gap A in the non-punched portion D of the workpiece 1009, resulting in defect in shape.

Although the respective punch members 1004 are formed to be lengthy in the vertical direction in FIG. 15, their first ends are merely supported by the punch holder 1002. Therefore, it is feared that the punch member 1004 may be deformed by the load exerted on the punch member 1004 during the stamping, or the punch member 1004 is broken due to the buckling.

When the punch member 1004 is exchanged due to any breakage or the like, it is necessary to perform the operation to scrape the cured adhesive by using a grinder or the like. However, during this operation, when the pitch for the punch members 1004 is small, for example, when the punch members 1004 are arranged at a pitch of not more than 0.6 mm, then the following inconvenience appears. That is, for example, a highly sophisticated technique is required for the operation to detach and attach only the punch member 1004 which is required to be exchanged. Further, it is complicated to perform the operation to insert all of the punch members 1004 into the holes 1006 of the stripper 1005 again.

SUMMARY OF THE INVENTION

The present invention has been made in order to dissolve the various problems described above, an object of which is to provide a punching apparatus for stamping and a method for producing the same in which the positional accuracy and the shape accuracy of the hole defined through a workpiece are improved by improving the positional accuracy of a punch member, the rigidity of the punch member can be improved, a stripper is prevented from application of any unbalanced load, and the punch member can be easily exchanged.

According to the present invention, there is provided a punching apparatus for stamping for applying perforating machining to a workpiece by using punch members, the apparatus comprising a punch holder secured to an upper die; a die member secured to a lower die; a plurality of grip members detachably fastened to the punch holder; and the plurality of punch members formed on each of the plurality of grip members.

Accordingly, it is unnecessary to individually assemble the punch members to the punch holder one by one, and hence there is no assembling error. Therefore, the positional accuracy of the punch member is improved, and the positional accuracy and the shape accuracy can be improved for the hole to be defined through the workpiece. Further, for example, even when the punch member has a slender pin-shaped configuration, it is possible to reduce the occurrence of fracture and breakage, because its rigidity is enhanced, which is preferred.

It is preferable for the punching apparatus for stamping according to the present invention that the grip member and the punch members are formed in an integrated manner by using a single material.

Accordingly, it is unnecessary to separately produce the grip member and the punch members so that they are assembled to one another. Therefore, the production steps are simplified, and any defect does not occur in positional accuracy of the punch member upon assembling. It is possible to further enhance the rigidity of the punch member.

It is preferable for the punching apparatus for stamping according to the present invention that the grip member has a rectangular cross section, and a plurality of grooves are formed on at least two opposing side walls of the rectangular cross section; and the punch holder is defined with a hole having a rectangular cross section corresponding to the grip member, and the grip member is fitted to the punch holder with a gap such that crosspieces formed between the grooves on the side walls of the grip member slidably contact with side walls of the hole of the punch holder. In this arrangement, it is more preferable that the crosspiece on the side wall of the grip member is formed to have a circular arc-shaped configuration. It is also preferable that the crosspiece involves a circular arc-shaped configuration with its top formed to be flat.

Accordingly, when the grip member integrally provided with the punch members is fitted to the hole of the punch holder, a large amount of adhesive can be contained in the gap between joining surfaces. The expanding effect of the adhesive is also exerted after the joining, because the joining surfaces of the grip member have a large areal size. Thus, it is possible to enhance the adhesive force between the grip member and the punch holder. The adhering performance is excellent as compared with the case in which a flat surface of a grip member is mutually joined to a flat surface of a punch holder.

In the punching apparatus for stamping according to the present invention for applying the perforating processing to the workpiece by using the punch members, it is preferable that the grip member is formed by being divided into two or more holding members, a plurality of grooves having a triangular cross section are formed on a joining surface of one holding member of the two holding members to be joined at a dividing surface, and a joining surface of the other holding member is formed to be flat; each of the punch members is formed to have a pin-shaped configuration; and first ends of the plurality of punch members are inserted into holes defined at the dividing surface.

Accordingly, the grip members and the punch members can be easily formed at a high degree of accuracy in an individual manner.

According to another aspect of the present invention, there is provided a method for producing a punching apparatus for stamping, the method being preferably used and comprising the steps of using a prism-shaped block as a material for the grip member and the punch members; machining a plurality of parallel long grooves separated from each other by arbitrary spacing distances on two opposing side walls of the prism-shaped block; machining tops of crosspieces formed between the long grooves to have a circular arc-shaped configuration; machining long grooves having an arbitrary depth on another side wall so that the long grooves communicate with the long grooves on the two side walls; simultaneously forming thereby the grip member including the plurality of long grooves and the circular arc-shaped crosspieces formed between the long grooves provided on the two opposing side walls and the plurality of punch members each having a lengthy rectangular cross section with its both ends provided with circular arc-shaped portions; and defining a plurality of holes each having a rectangular cross section on the punch holder on the other hand; wherein the grip member is fitted to the punch holder with a gap such that the crosspieces formed on the side walls of the grip member slidably contact with side walls of the hole of the punch holder.

In this arrangement, it is also preferable that the circular arc-shaped top of the crosspiece formed on the side wall of the grip member and the circular arc-shaped portion at the both ends of the punch member are deformed to include flat portions. It is also allowable to omit the step of machining and forming the plurality of parallel long grooves on the side walls of the prism-shaped block by machining and forming the plurality of parallel circular arc-shaped crosspieces on the side walls of the prism-shaped block (see FIG. 7B).

Accordingly, it is possible to further simplify the operation steps for integrally producing the grip members and the punch members, which is preferred.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 12 shows a perspective view illustrating a stamping punch and a fixing jig for punch members used for a punching apparatus for stamping according to a second embodiment of the present invention;

FIG. 14A shows a partial magnified schematic longitudinal sectional view illustrating a state in which holes are formed through a punch holder;

FIG. 14B shows a partial magnified schematic sectional view illustrating a state in which the holes are finished by means of wire electric discharge machining; and FIG. 15 shows a partial magnified schematic longitudinal sectional view illustrating a stamping punch concerning the conventional technique.

DESCRIPTION OF THE PREFERRED EMBODIMENTS

The punching apparatus for stamping according to the present invention will be exemplified by preferred embodiments in relation to the production method thereof, and it will be explained in detail below with reference to the accompanying drawings.

Figure 1:
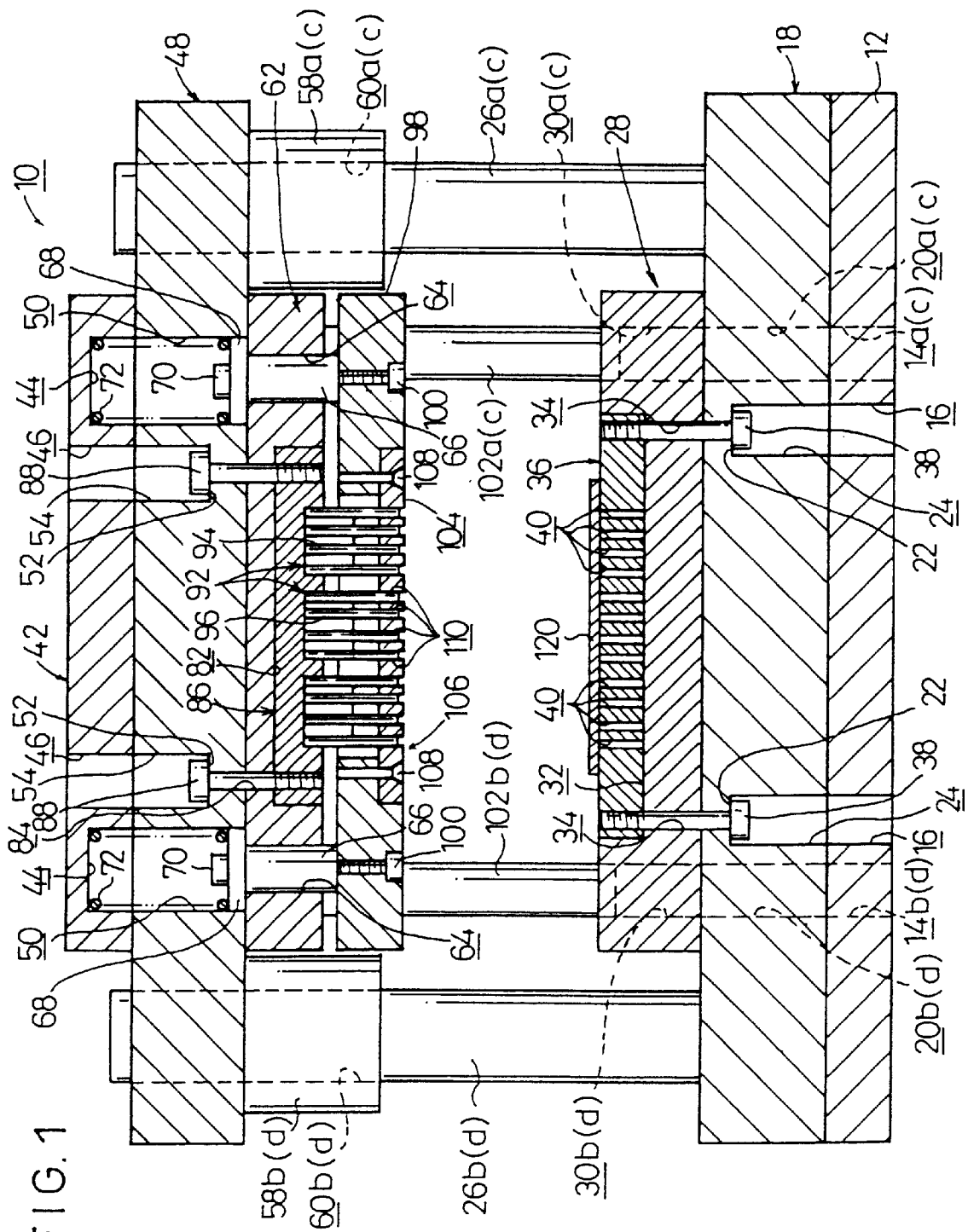
FIG. 1 shows a longitudinal sectional view illustrating a punching apparatus for stamping according to a first embodiment of the present invention.
Figure 2:
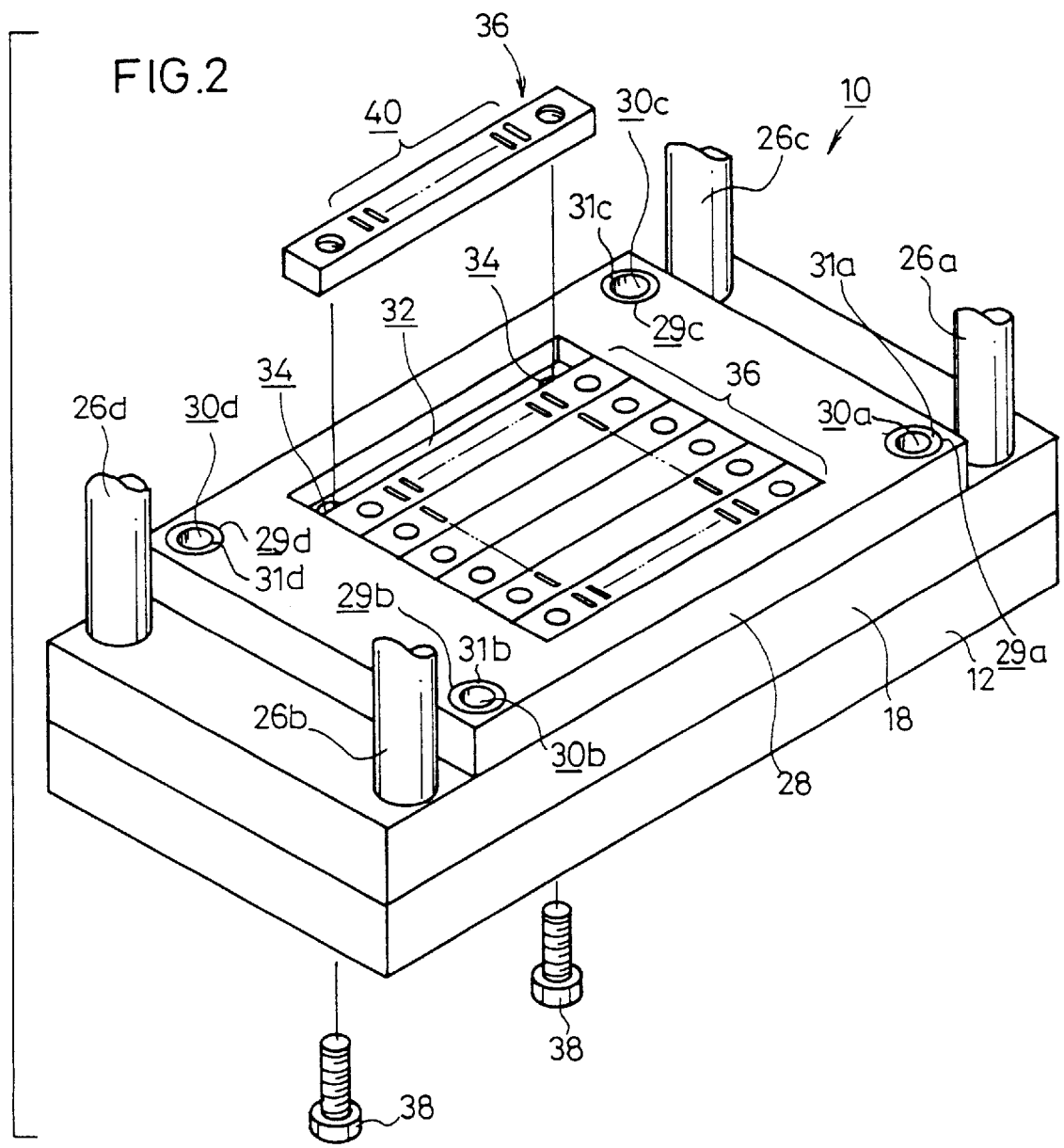
FIG. 2 shows an exploded perspective view illustrating a lower die of the punching apparatus for stamping shown in FIG. 1.

With reference to FIG. 1, reference numeral 10 indicates a punching apparatus for stamping according to the first embodiment of the present invention. As shown in FIGS. 1 and 2, the stamping punching apparatus 10 includes a lower die attachment member 12. Holes 14a to 14d are defined through the lower die attachment member 12. Holes 16 are defined at the inside of the holes 14a to 14d. A plate-shaped lower die 18 is secured to an upper portion of the lower die attachment member 12. Holes 20a to 20d, which have the same diameter as that of the holes 14a to 14d and which coaxially communicate with the holes 14a to 14d, are defined through the lower die 18. Holes 24 having steps 22 are defined at the inside of the holes 20a to 20d so that they communicate with the holes 16. Main posts 26a to 26d, which extend upwardly, are provided in an upstanding manner in the vicinity of corners of the lower die 18.

A plate-shaped die-fixing plate 28 are secured to an upper portion of the lower die 18. Holes 30a to 30d, which have the same diameter as that of the holes 20a to 20d and which coaxially communicate with the holes 20a to 20d, are defined in the vicinity of corners of the die-fixing plate 28. A recess 32 is defined at an upper portion of the die-fixing plate 28. Holes 34, which communicate with the holes 24, are defined through the bottom for forming the recess 32. A plurality of die members 36, which are formed to have a rectangular parallelepiped-shaped configuration, are fitted to the recess 32 (see FIG. 2). The die member 36 is secured to the die-fixing plate 28 by using screws 38. A plurality of lengthy holes 40, which correspond to lengthy holes to be defined through a sheet material as a workpiece as described later on, are defined through each of the die members 36.

Figure 3:
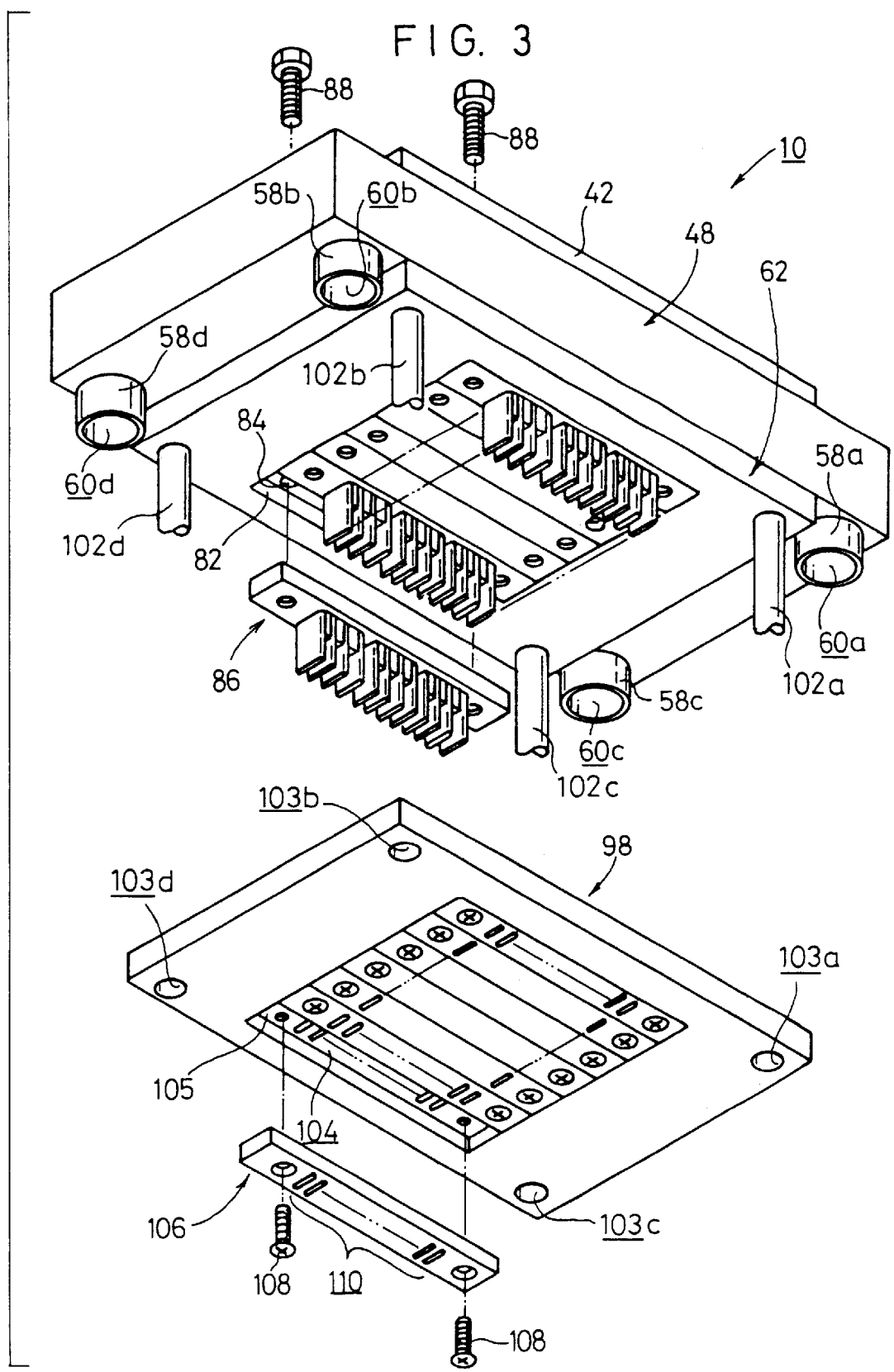
FIG. 3 shows an exploded perspective view illustrating an upper die of the punching apparatus for stamping shown in FIG. 1.

As shown in FIGS. 1 and 3, the stamping punching apparatus 10 is provided with an upper die attachment member 42 which is capable of making approach and separation with respect to the lower die attachment member 12. The upper die attachment member 42 is defined with a plurality of recesses 44 and a plurality of holes 46 formed at the inside of the recesses 44. An upper die 48 is secured to a lower portion of the upper die attachment member 42. Holes 50, which have the same diameter as that of the recesses 44 and which coaxially communicate with the recesses 44, are defined through the upper die 48. A plurality of holes 54 having steps 52 are defined to make communication with the holes 46. Main post guides 58a to 58d, which protrude downwardly, are formed in the vicinity of corners of the upper die 48. The main posts 26a to 26d are inserted into holes 60a to 60d of the main post guides 58a to 58d.

A punch holder-fixing plate 62 is secured to a lower portion of the upper die 48. The punch holder-fixing plate 62 is defined with holes 64 which communicate with the holes 50 and which have a diameter smaller than that of the holes 50. Columnar members 66 are slidably inserted into the hole 64. Flanges 68, which protrude outwardly, are secured by screws 70 to upper portions of the columnar members 66. The flanges 68 are displaceable in the axial direction at the inside of the holes 50. The flanges 68 abut against the upper surface of the punch holder-fixing plate 62, and thus the columnar members 66 are prevented from disengagement. First ends of spring members 72 abut against upper portions of the flanges 68. Second ends of the spring members 72 abut against ceilings for forming the recesses 44. Therefore, the columnar members 66 are urged downwardly by the spring members 72.

As shown in FIGS. 1 and 3, a rectangular recess 82 is defined at a lower portion of the punch holder-fixing plate 62. Holes 84, which communicate with the holes 54, are defined through the ceiling for forming the recess 82. A plurality of punch holders 86, which are formed to have a rectangular parallelepiped-shaped configuration, are fitted to the recess 82. The punch holders 86 are secured to the punch holder-fixing plate 62 by using screws 88 inserted into the holes 84.

Figure 4:
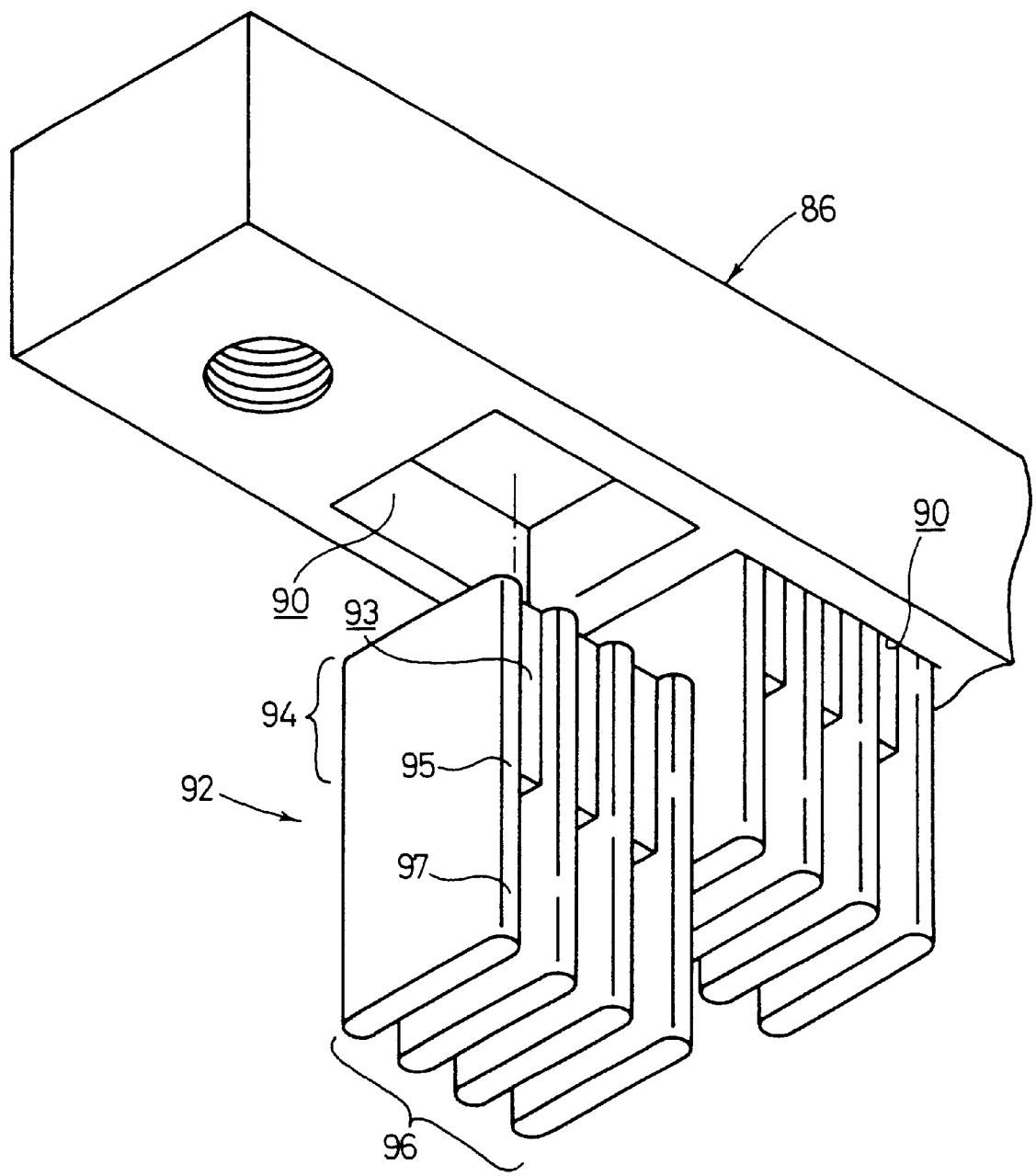
FIG. 4 shows a perspective view illustrating a stamping punch used for the punching apparatus for stamping shown in FIG. 1.

As shown in FIG. 4, the punch holder 86 is defined with a plurality of long holes 90. A stamping punch 92 is inserted and secured into each of the long holes 90. The stamping punch 92 includes a grip member 94 and punch members 96 which are provided in an integrated manner. The grip member 94 has a lengthy rectangular configuration including a plurality of long grooves 93 and circular arc-shaped crosspieces 95 formed between the long grooves 93 which are formed on side walls in the longitudinal direction thereof. The punch member 96 has a lengthy rectangular cross section including circular arc-shaped sections 97 which are formed at both ends in the longitudinal direction thereof. Each of the punch members 96 protrudes from the lower surface of the grip member 94 toward the die member 36.

Figure 5:
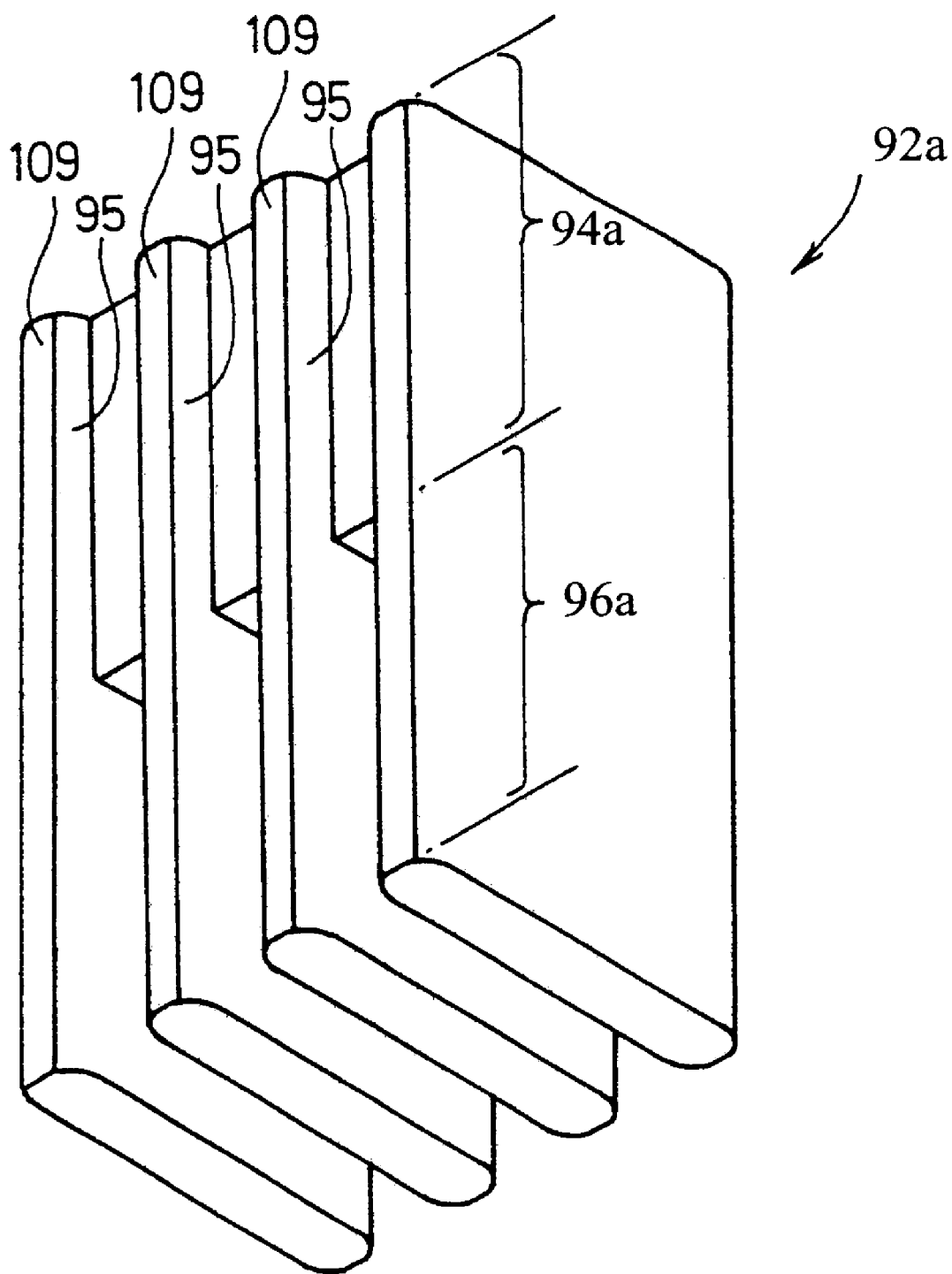
FIG. 5 shows a perspective view illustrating a first modified embodiment of the stamping punch.

In this arrangement, as in the first modified embodiment shown in FIG. 5, it is also preferable that 25 forward ends of circular arc-shaped tops of the crosspieces 95, which are indicated by reference numeral 109 and which are formed on the side walls of the grip member 94, are deformed to include flat portions. Alternatively, as in the second modified embodiment shown in FIG. 6, it is also preferable that the side walls of the grip member 94 are made flat, and the plurality of punch members 96 have a pin-shaped configuration.

When the length of protrusion of the punch member 96 from the grip member 94 is formed to be short, then the rigidity of the punch member 96 is improved to decrease the fear of deformation and buckling of the punch member 96. On the other hand, when the length is formed to be long, then it is possible to increase the number of grinding operations performed to use the worn punch member 96 again, and thus the service life of the punch member 96 is prolonged.

As shown in FIGS. 1 and 3, a stripper-fixing plate 98 is arranged under the punch holder-fixing plate 62. The upper surface of the stripper-fixing plate 98 is fixed to the columnar members 66 by using screws 100. Subposts 102a to 102d, which penetrate through holes 103 disposed in the vicinity of corners of the stripper-fixing plate 98 and which extend downwardly, are provided at lower portions of the punch holder-fixing plate 62. Therefore, the stripper-fixing plate 98 is supported such that it is capable of making approach and separation with respect to the punch holder-fixing plate 62. As shown in FIG. 1, the lower portions of the subposts 102a to 102d are slidably inserted into the holes 14a to 14d, 20a to 20d, 30a to 30d.

Accordingly, when the upper die 48 makes the displacement in the direction to make approach or separation with respect to the lower die 18, the lower die 18 and the upper die 48 are prevented from positional deviation by the aid of the main posts 26a to 26d and the subposts 102a to 102d.

A recess 104 is defined at a lower portion of the stripper-fixing plate 98. A plurality of strippers 106, which are formed to have a rectangular parallelepiped-shaped configuration, are fitted to the walls 105 for forming the recess 104. The stripper 106 is secured to the stripper-fixing plate 98 by using screws 108. A plurality of long holes 110, through which the punch members 96 are slidably inserted, are defined through the stripper 106. A recess 111 for advancing an unillustrated machining tool is defined on the upper surface of the stripper 106 in order to facilitate the perforating machining for the long holes 110.

The stamping punching apparatus 10 according to the first embodiment of the present invention is basically constructed as described above. Next, its production process will be explained.

At first, explanation will be made with reference to FIGS. 7A to 7D for the method for producing the grip member 94 and the punch members 96.

Figure 7:
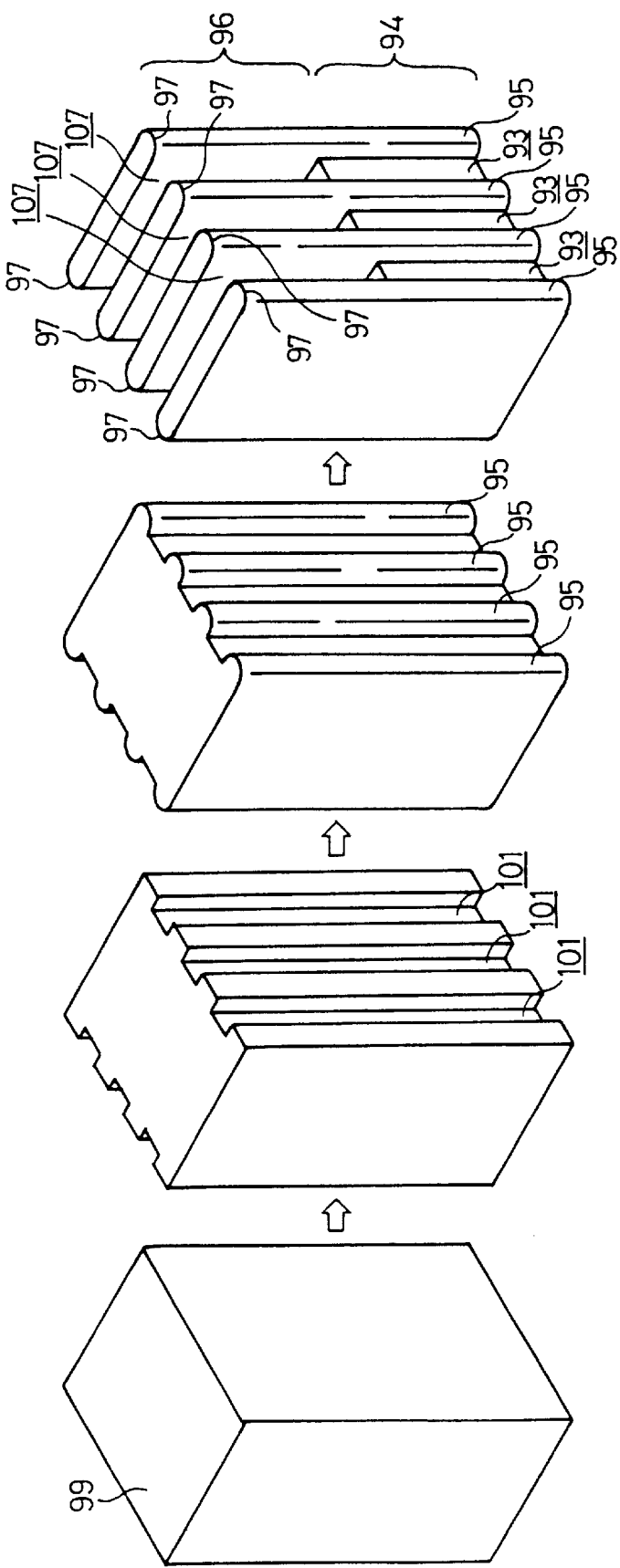
FIG. 7A shows a step of machining a material to form a rectangular parallelepiped.
FIG. 7B shows a step of machining the rectangular parallelepiped to form long grooves on its side walls.
FIG. 7C shows a step of machining projections between the long grooves to form circular arc-shaped crosspieces.
FIG. 7D shows a step of finally forming a grip member and punch members in an integrated manner.

As shown in FIG. 7A, a material such as a general cemented carbide material is subjected to surface grinding machining for six surfaces by using an unillustrated surface grinding machine to form a lengthy rectangular parallelepiped 99. Subsequently, as shown in FIG. 7B, long grooves 101 having a rectangular cross section are formed on two opposing side walls of the rectangular parallelepiped 99. Further, as shown in FIG. 7C, projections between the long grooves 101 on the side walls are formed into crosspieces 95 having a circular arc-shaped cross section by using an unillustrated numerical control machine tool.

Further, as shown in FIG. 7D, long grooves 107 having a predetermined depth are formed on another side wall so that the long grooves 107 communicate with the long grooves 101 on the two side walls described above. Accordingly, the grip member 94 including the plurality of long grooves 93 and the crosspieces 95 formed between the long grooves 93 on the two side walls, and the plurality of punch members 96 having a lengthy rectangular cross section with the circular arc-shaped section 97 formed at the both ends are formed in an integrated manner.

Conventionally, the stamping punch has been formed by using an ultra-fine grain cemented carbide material which is provided with a high hardness as well as a high toughness, and it is produced by performing grinding by using a grinding stone or the like to form a punch member 96. However, in the case of a soft workpiece such as a green sheet, the stamping load is small, and the little wear occurs. Therefore, as described in the embodiment of the present invention, the perforating machining can be applied by using the stamping punch 92 which is formed by processing the general cemented carbide material by means of the electric discharge machining.

In this process, the grip member 94 and the punch members 96 are formed in the integrated manner. Therefore, the production steps for the stamping punch 92 can be simplified. Further, the rectangular parallelepiped 99, which has the flat surface with a high machining accuracy, is formed by using the surface grinding machine. Furthermore, the circular arc-shaped crosspieces 95, which has a high machining accuracy, are formed on the side walls of the grip member 94 by using the NC machining machine. In this process, it is also preferable that the crosspiece 95 having the circular arc-shaped configuration with the flat top according to the first modified embodiment shown in FIG. 5 is formed by performing the grinding by using the NC machining machine while partially leaving the flat portion formed by the surface grinding machining, in place of the crosspiece 95 between the long grooves 93 on the side wall formed to have the circular arc-shaped cross section by using the NC machining machine. The partially remaining flat portion has been previously formed by means of the surface grinding machining in which the accuracy can be easily obtained. Therefore, it is possible to obtain the high flatness as compared with the formation performed by using the NC machining machine.

During the production process, an intermediate inspection is performed to confirm the fitting accuracy by inserting the stamping punch 92 into the long hole 90 of the punch holder 86 (see FIG. 4) at the stage at which the surface grinding machining is applied to the six surfaces of the material (see FIG. 7A) and at the stage at which the long grooves 101 are formed on the side walls of the rectangular parallelepiped 99 (see FIG. 7B) respectively. If any defect in fitting accuracy is confirmed in the intermediate inspection, the machining is performed again for the purpose of repair. Therefore, there is no useless advance to the subsequent production steps while leaving any defective shape.

Figure 6:
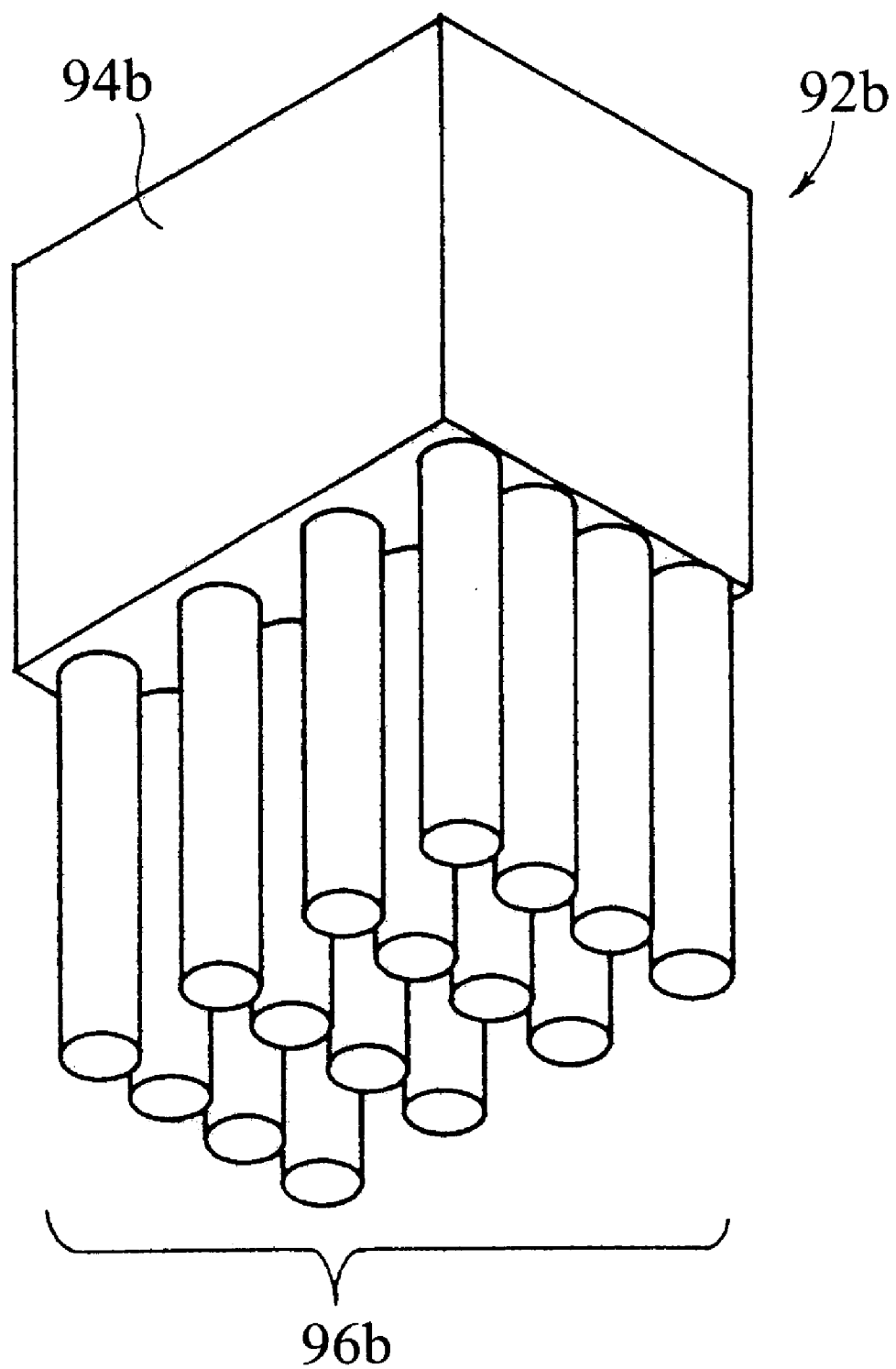
FIG. 6 shows a perspective view illustrating a second modified embodiment of the stamping punch.

On the other hand, when the punch members 96 having the pin-shaped configuration according to the second embodiment shown in FIG. 6 are formed, the punch members 96 having the narrow spacing distance or having the small diameter can be highly accurately produced by applying, for example, the wire electric discharge machining.

The stamping punch 92 thus produced is inserted and fitted into the long hole 90 of the punch holder 86, and the portion of the grip member 94 is secured by using an adhesive or the like.

In this process, if the grip member 94, which is joined to the side walls of the long hole 90 of the punch holder 86, has a flat surface over its side walls, it is necessary to increase the machining accuracy in order to increase the fitting accuracy. On this condition, even if the fitting accuracy is increased, the adhesive merely enters the minute gap between the joined surfaces. As a result, the adhesive strength is defective, and it is impossible to obtain any good fitted state. For example, problems arise in that the adhered portion is peeled off during the punching process described later on, and the stamping punch 92 is disengaged. In such a circumstance, it may be conceived that the forcible insertion or the shrinkage fitting is performed upon the fitting. However, such a procedure is not preferred because the stress generated thereby remains, and any strain is caused.

Figure 8:
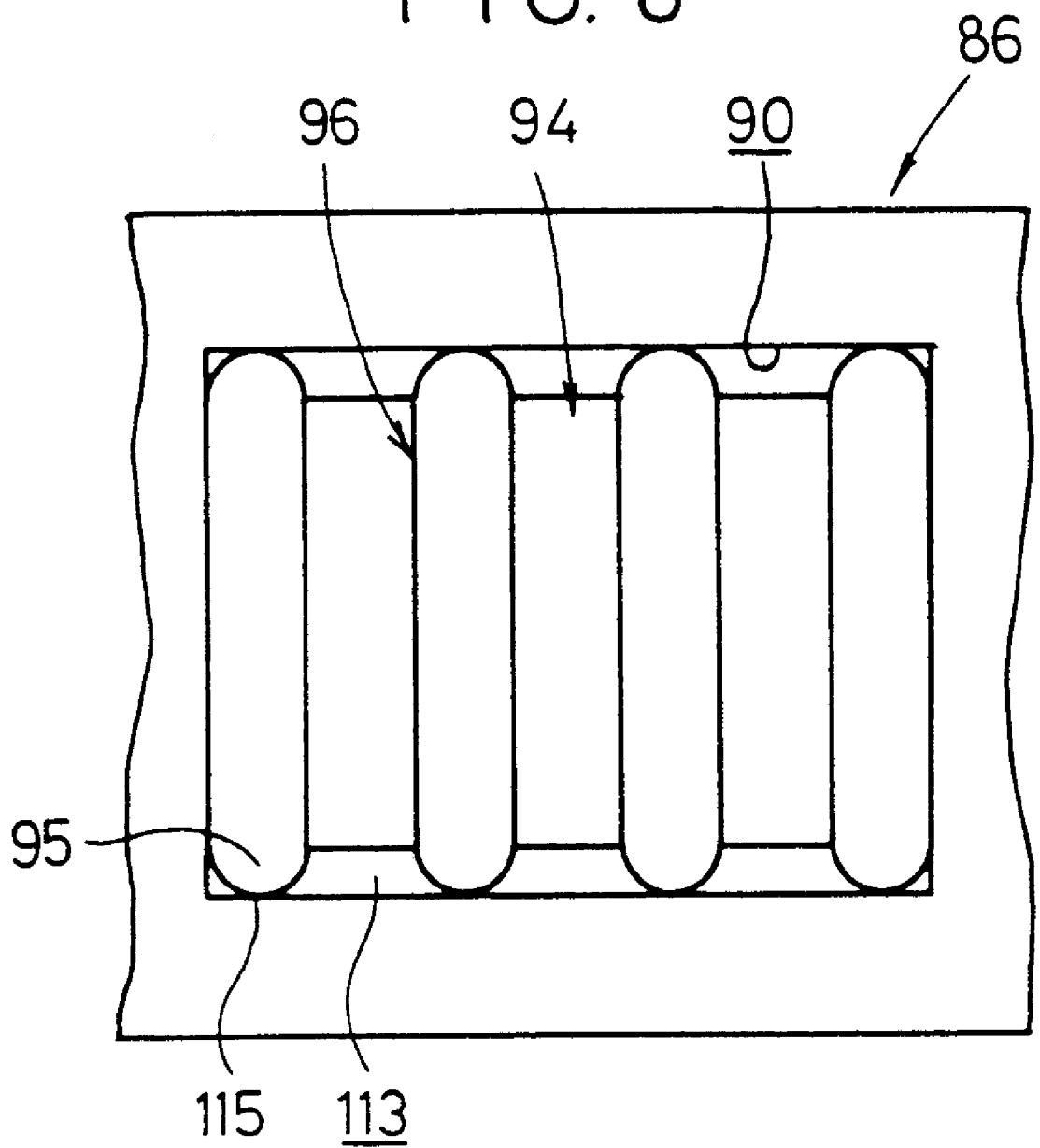
FIG. 8 shows a plan view as viewed from a side of the stamping punch in order to explain a fitting state of the stamping punch and the punch holder according to the first embodiment of the present invention.
Figure 9:
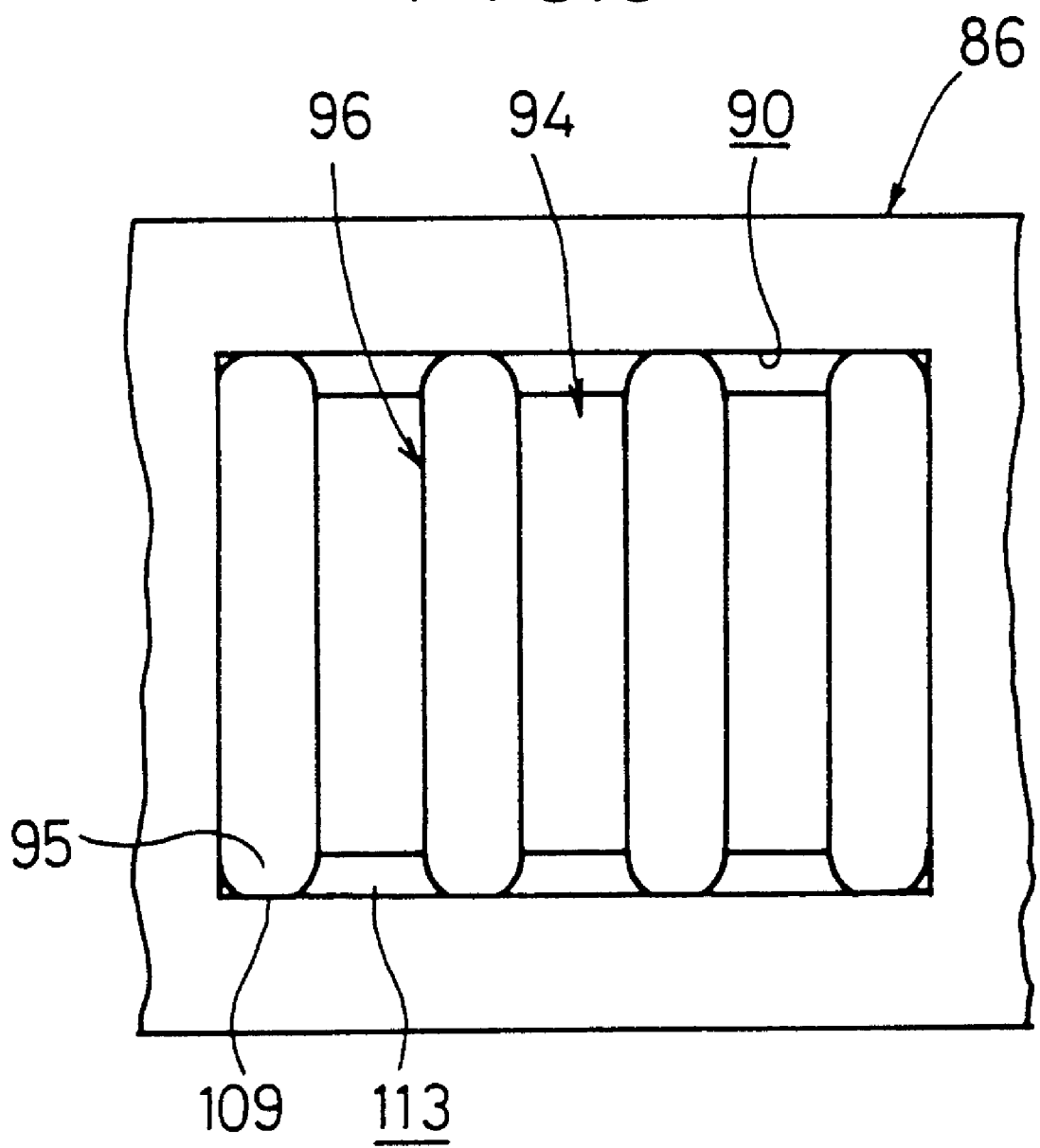
FIG. 9 shows a plan view as viewed from a side of the stamping punch in order to explain a fitting state of the stamping punch and the punch holder according to a modified embodiment of the first embodiment of the present invention.

On the contrary, as in the first embodiment of the present invention shown in FIG. 8 and the first modified embodiment shown in FIG. 9, a sufficient gap 113 is provided for the joined surfaces when the fitting is performed. Accordingly, a large amount of adhesive can be contained in the space of the gap 113. Further, the expanding effect of the adhesive after the joining is also added, because the areal size of the joined surfaces is large on the side of the grip member 94. Thus, it is possible to obtain a large adhesive force.

In this state, the linear portion indicated by reference numeral 115 in FIG. 8, or the flat portion indicated by reference numeral 109 in FIG. 9, which is formed and machined highly accurately by means of the surface grinding machining for the six surfaces, remains at the top of the crosspiece 95 of the side wall of the grip member 95. These portions slidably make line-to-line or surface-to-surface contact with the side walls of the long hole of the punch holder 86. Therefore, the fitting accuracy is excellent.

Subsequently, as shown in FIG. 3, the punch holders 86 are installed to the recess 82 of the punch holder-fixing plate 62, and they are secured by using the screws 88. As shown in FIG. 1, the punch members 96 are inserted into the holes 110 of the stripper 106, and the stripper 106 is secured to the stripper-fixing plate 98 by using the screws 108.

Next, explanation will be made for the operation of the stamping punching apparatus constructed as described above, especially for the operation effected when the stamping punching apparatus 92 according to the second modified embodiment (see FIG. 6) is used. At first, as shown in FIG. 1, a sheet material 120 such as a ceramic green sheet is placed on the die members 36.

Figure 10:
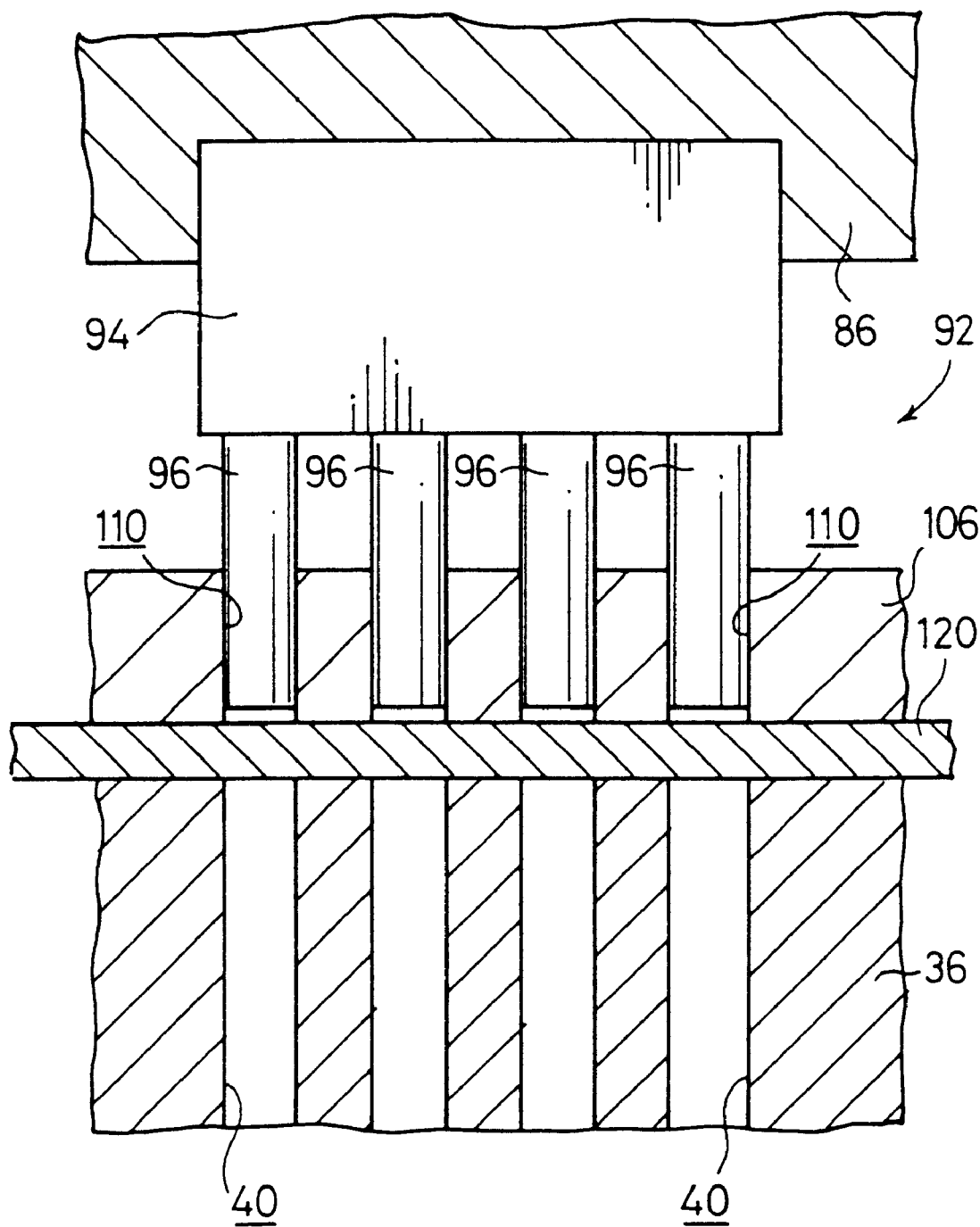
FIG. 10 shows a partial magnified sectional view illustrating a state in which a stripper abuts against a sheet material, depicting the method for using the punching apparatus for stamping shown in FIG. 1.

Subsequently, when the upper die attachment member 42 is moved downwardly in accordance with the action of an unillustrated driving source, the lower surface of the stripper 106 abuts against the upper surface of the sheet material 120 as shown in FIG. 10. The sheet material 120 is pressed against the stripper 106 by the aid of the resilient force of the spring member 72 shown in FIG. 1. Accordingly, the sheet material 120 is positioned, and it is prevented from positional deviation.

Figure 11:
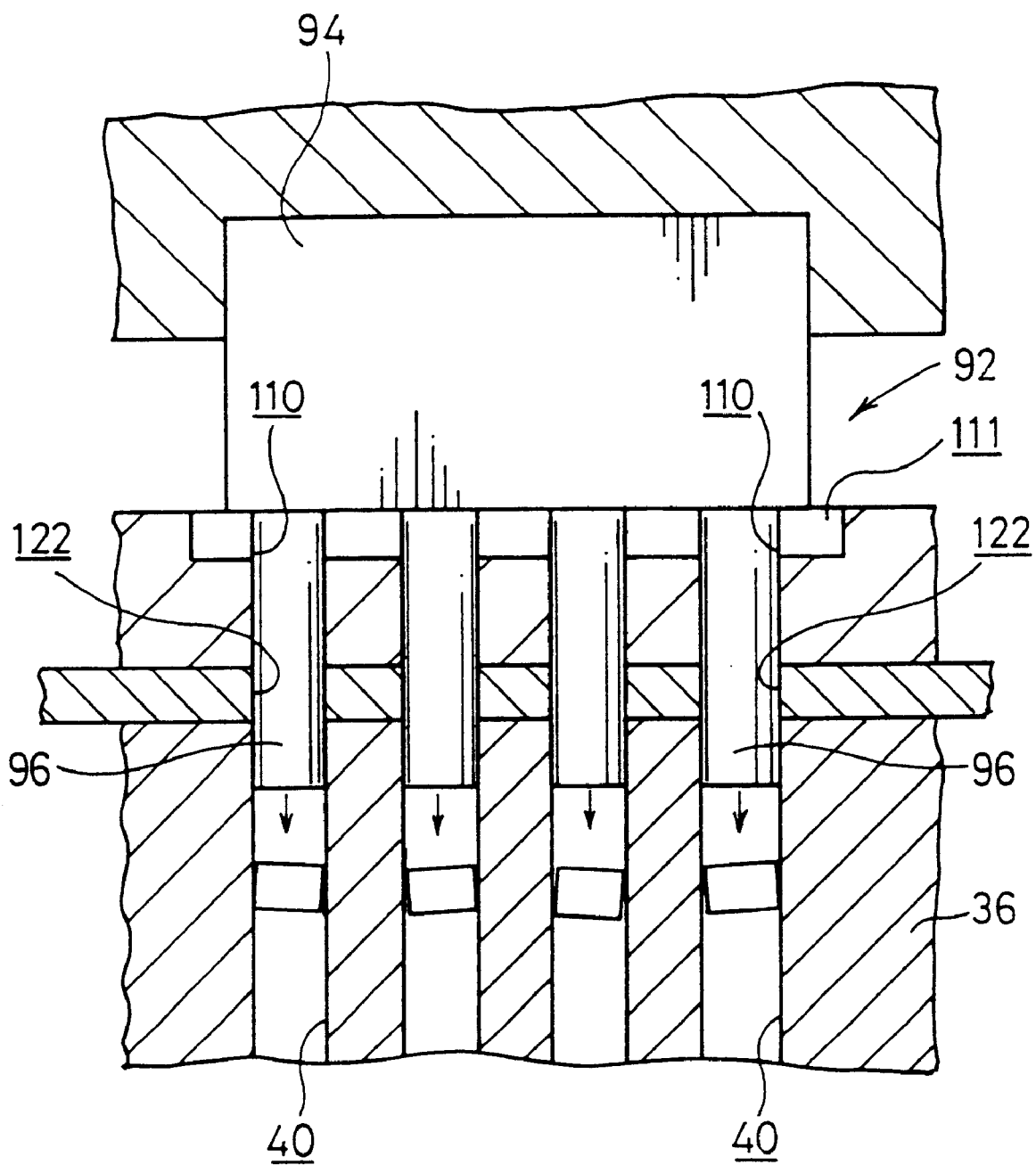
FIG. 11 shows a partial magnified sectional view illustrating a state in which the sheet material is subjected to perforating machining, depicting the method for using the punching apparatus for stamping shown in FIG. 1.

When the upper die attachment member 42 is further moved downwardly, the spring member 72 is contracted. As shown in FIG. 11, the forward ends of the punch members 96 protrude from the holes 110 of the stripper 106. Thus, long holes 122 are defined through the sheet material 120.

In the present invention, the punch members 96 are formed integrally with the grip members 94, and the grip members 94 are fitted to the punch holders 86 at a high degree of accuracy. Therefore, the positional accuracy of the punch member is improved. Accordingly, the positional accuracy and the shape accuracy of the long holes 122 defined through the sheet material 120 are improved. Further, the space between the hole 122 and the adjoining hole 122 of the sheet material 120 is appropriately supported by the die member 36. Accordingly, the sheet material 120 is prevented from inclination and breakage. Further, the rigidity of the punch member is also improved, and hence no unbalanced load is exerted on the stripper.

Subsequently, when the unillustrated driving source is energized in an opposite direction, then the upper die attachment member 42 is moved upwardly, and the punch members 96 and the stripper 106 are separated from the sheet material 120. Thus, the sheet material 120 subjected to the perforating machining is obtained.

When the punch member 96 is broken or worn, and it is required to be exchanged, then the stamping punch 92 including the punch member 96 required to be exchanged is detached from the long hole 90 of the punch holder 86. Subsequently, a grip member 94 of a stamping punch 94 for exchange is inserted and secured into the long hole 90. The punch member 96 is inserted into the hole 110 of the stripper 106. The punch members 96 are easily inserted into the holes 110, because the respective punch members 96 have the high positional accuracy.

Next, a stamping punching apparatus according to the second embodiment of the present invention will be explained in relation to the production process thereof. Explanation will be made below for components or parts different from those of the stamping punching apparatus 10 according to the first embodiment. The same components or parts as those of the first embodiment are designated by the same reference numerals in the drawings, detailed explanation of which will be omitted.

As shown in FIG. 12, in this embodiment, the stamping punch 92 is formed by the grip member 94 divided into a plurality of components so that the punch members 96 are interposed thereby. That is, the grip member 94 is constructed separately from the punch members 96 in this embodiment. The grip member 94 used in this embodiment comprises a first holding member 114 which is disposed at the center of the grip member 94 and which is formed to have a lengthy configuration. Both side portions of the first holding member 114, which are disposed along the longitudinal direction, are formed as flat sections 115a, 115b.

A pair of second holding members 116a, 116b, which are formed to have a lengthy configuration, are arranged for the respective flat sections 115a, 115b. A plurality of grooves 124 are defined in parallel to one another in a direction perpendicular to the longitudinal direction of the second holding member 116a, 116b, on the lengthy wall surface of the second holding member 116a, 116b. The groove 124 is formed to have a substantially V-shaped configuration.

A recess 117 is defined on the bottom of the first holding member 114. On the other hand, recesses 118a, 118b are defined on the second holding members 116a, 116b. A chamber 123 is formed by the recess 117 and the recesses 118a, 118b.

When a plurality of punch members 96 are secured to the grip member 94 formed as described above, a fixing jig 130 is used. The fixing jig 130 comprises a first jig 132 which is placed on an upper portion of the first holding member 114 and which is formed to have a rectangular parallelepiped-shaped configuration, and second jigs 134a, 134b which are placed on upper portions of the second holding members 116a, 116b and which are defined with grooves 136 each having a V-shaped cross section communicating with the grooves 124. Bar members 135a, 135b for gripping the first jig 132 are secured to upper portions of the first jig 132.

When the plurality of punch members 96 are secured to the grip member 94, the first jig 132 is firstly placed on the upper portion of the first holding member 114. In this state, the first holding member 114 is separated from the second holding members 116a, 116b. Subsequently, when the second jigs 134a, 134b are placed on the second holding members 116a, 116b, the grooves 124 communicate with the grooves 136. Subsequently, the punch members 96 are arranged in the grooves 124 and the grooves 136.

Figure 13:
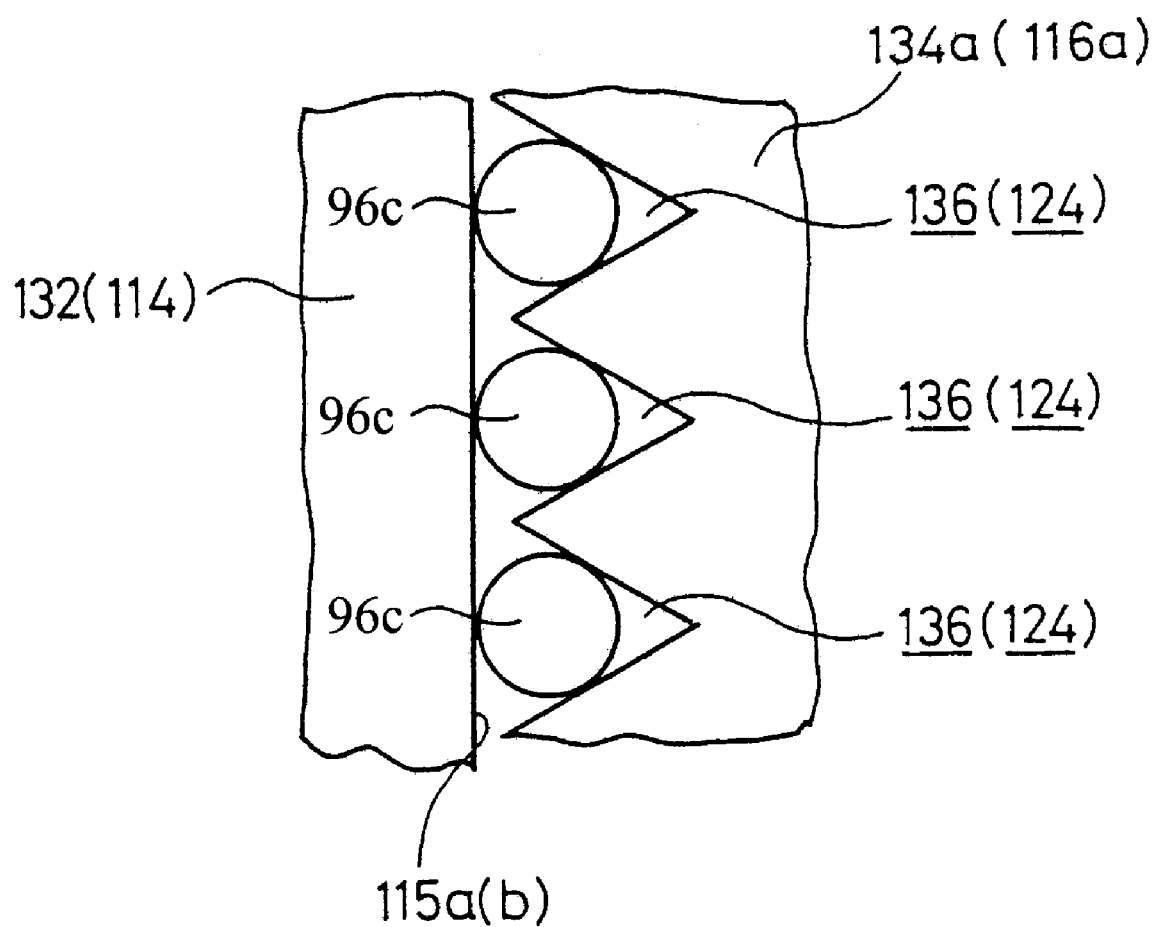
FIG. 13 shows a partial magnified plan view illustrating the stamping punch and the fixing jig shown in FIG. 12.

The first holding member 114 is interposed by the second holding members 116a, 116b, and the first jig 132 is interposed by the second jigs 134a, 134b. Accordingly, as shown in FIG. 13, the plurality of punch members 96 are positioned in parallel to one another by being interposed by the walls for forming the grooves 124, 136 and the walls of the first holding member 114 and the second jigs 134a, 134b.

In this state, the punch members 96 are interposed by the walls for forming the grooves 124, 136 and the walls of the first holding member 114 and the second jigs 134a, 134b, and they are positioned with a high positional accuracy. As shown in FIG. 12, an adhesive is charged into the chamber 123. When the adhesive is cured, the punch members 96 are secured highly accurately by the first holding member 114 and the second holding members 116a, 116b. Thus, the stamping punch 92 is produced.

When the stamping punch 92 is produced as described above, the punch members 96 can be highly accurately secured to the punch holder 86, for example, even in the case of a minute punch in which the punch member 96 has a diameter of not more than 0.3 mm. The plurality of punch members 96 are aligned on one grip member 94. Therefore, it is possible to arbitrarily select the number of stamping punches 92 necessary for one stamping punching apparatus.

Subsequently, as shown in FIG. 4, the stamping punch 92 is inserted into the long hole 90 of the punch holder 86 in the same manner as in the first embodiment (the other constitutive components except for the stamping punch 92 and the punch holder 86 of the second embodiment are the same as those of the first embodiment, and explanation will be made below by using the drawings and reference numerals described in the first embodiment).

As shown in FIG. 3, the punch holders 86 are installed to the recess 82 of the punch holder-fixing plate 62, and they are secured by using the screws 88. Subsequently, as shown in FIG. 1, the punch members 96 are inserted into the holes 110 of the stripper 106. The stripper 106 is secured to the stripper-fixing plate 98 by using the screws 108. Thus, the stamping punching apparatus is obtained.

In the stamping punching apparatus according to the second embodiment described above, the punch member 96 is formed to have the circular cross section. However, other configurations are available, including, for example, oblong or elliptic configurations. Further, the grip member 94 may be formed to connect the plurality of punch members 96.

What is claimed is:

1. A punching apparatus for applying perforating machining to a workpiece by using punch members, said apparatus comprising:

a punch holder secured to an upper die, said punch holder having a plurality of longitudinal holes formed therein, wherein each of said plurality of longitudinal holes has a rectangular cross section;

a die member secured to a lower die;

a plurality of grip members detachably fastened to said punch holder, said plurality of grip members each having a rectangular cross section corresponding to that of said longitudinal holes, and a plurality of grooves formed on at least two opposing side walls of said rectangular cross section, wherein each of said grip members is fitted to said punch holder with a gap such that crosspieces formed between said grooves on said side walls of each said grip member have a circular arc-shaped configuration and slidably contact with side walls of each respective longitudinal hole, such that the position of each grip member relative to said punch holder is determined by the position of each respective longitudinal hole.

2. The punching apparatus according to claim 1, wherein said grip member and said punch members are formed in an integrated manner by using a single material.

3. A punching apparatus for applying perforating machining to a workpiece by using punch members, said apparatus comprising:

a punch holder secured to an upper die, said punch holder having a plurality of longitudinal holes formed therein, wherein each of said plurality of longitudinal holes has a rectangular cross section;

a die member secured to a lower die;

a plurality of grip members detachably fastened to said punch holder, said plurality of grip members each having a rectangular cross section corresponding to that of said longitudinal holes, and a plurality of grooves formed on at least two opposing side walls of said rectangular cross section, wherein each of said grip members is fitted to said punch holder with a gap such that crosspieces formed between said grooves on said side walls of each said grip member have a circular arc-shaped configuration with a flat top and slidably contact with side walls of each respective longitudinal hole, such that the position of each grip member relative to said punch holder is determined by the position of each respective longitudinal hole.

4. The punching apparatus according to claim 3, wherein said grip member and said punch members are formed in an integrated manner by using a single material.

* * * * *